United States Patent [19]

Rubertus et al.

[11] Patent Number: 6,020,711
[45] Date of Patent: Feb. 1, 2000

[54] MULTIPLE WINDING CHANNEL, MAGNETIC COUPLING-ALTERABLE RELUCTANCE ELECTRICAL MACHINES AND THEIR FAULT TOLERANT CONTROL

[75] Inventors: C. Scott Rubertus, Centerville; Joseph A. Weimer, Springboro, both of Ohio

[73] Assignee: The United States of America as represented by the Secretary of the Air Force, Washington, D.C.

[21] Appl. No.: 09/038,486

[22] Filed: Mar. 5, 1998

[51] Int. Cl.[7] .................................................. H02P 7/00
[52] U.S. Cl. ............................................ 318/701; 318/254
[58] Field of Search ..................... 318/701, 254, 318/439, 685, 696, 434, 430, 706, 707

[56] References Cited

U.S. PATENT DOCUMENTS

| | | | |
|---|---|---|---|
| 4,434,389 | 2/1984 | Langley et al. | 318/254 |
| 4,595,865 | 6/1986 | Jahns | 318/254 |
| 4,625,158 | 11/1986 | Taenzer | 318/701 |
| 4,896,088 | 1/1990 | Jahns | 318/696 |
| 4,896,089 | 1/1990 | Kliman et al. | 318/701 |
| 5,198,972 | 3/1993 | Lafuze . | |
| 5,578,880 | 11/1996 | Lyons et al. | 310/90.5 |
| 5,703,421 | 12/1997 | Durkin . | |

*Primary Examiner*—Jonathan Salata
*Attorney, Agent, or Firm*—Gerald B. Hollins; Thomas L. Kundert

[57] ABSTRACT

A reluctance motor/generator system in which a winding failure event in one channel of a multiple channel multiple phased stator assembly is accommodated by removal of the failed winding from the reluctance motor/generator machine's electrical circuit using electrical switching and an acceptance of reduced machine output capability. This electrical switching also accomplishes a reversal of magnetic polarity in poles of one remaining normal channel of the machine. The magnetic polarity reversal as accomplished electrically largely excludes secondary magnetic flux from stator poles carrying the failed winding and its associated phase windings of the channel and thereby precludes electrical energy generation in the failure event pole. In the thus achieved channel-removed mode of machine operation, a different more elongated magnetic flux path through the machine rotor and stator elements becomes active and provides reduced but usable electrical output from the machine. Military and non-military uses of the system in both motor and generator functions are contemplated. Aircraft and ground-based uses of the invention are also contemplated.

22 Claims, 8 Drawing Sheets

MULTIPLE WINDING CHANNEL, MAGNETIC COUPLING-ALTERABLE RELUCTANCE ELECTRICAL MACHINES AND THEIR FAULT TOLERANT CONTROL

RIGHTS OF THE GOVERNMENT

The invention described herein may be manufactured and used by or for the Government of the United States for all governmental purposes without the payment of any royalty.

BACKGROUND OF THE INVENTION

This invention concerns the field of electrical energy transducer apparatus i.e., electrical motor and generator machines, especially of the switched reluctance motor/generator type, which may be useful in demanding environments such as in an aircraft. The invention is concerned with the maintenance of partial operation in such apparatus under component failure conditions.

In the design of military aircraft an American philosophy has historically considered crew safety and the return to base under extremes of battle damage items of design priority. A striking example of this philosophy is found in World War II equipment wherein the piston and propeller driven P-38, P-47 and F-51 tactical aircraft were sometimes placed at speed, maneuverability and range disadvantages relative to directly encountered concurrent era enemy aircraft—at least partly because of armor plate and redundant systems incorporated into the American planes. Many who followed the air war in Europe and the South Pacific are also familiar with stories of bomber aircraft incorporating this philosophy limping home with disabled engines, electrical interruptions and missing control surface as a result of battle damage, a return enabled at least in part by observation of this return to home philosophy in the aircraft's design. A perhaps extreme example of the opposite to this philosophy may be found in the practice of omitting the weight and space penalties attending even a parachute in some of the missions and the enemy aircraft used in this era.

A considerable measure of this philosophy has survived into the present day and into the design of jet propelled aircraft and their subsystems. In particular considering the heavy reliance on electronic systems in a present day aircraft there has been an ongoing effort to provide many military aircraft with a reliable and battle hardened source or sources of electrical energy. In multiple engine aircraft this effort is often manifest in the form of plural electrical energy sources, e.g., alternators or direct current generators energized by separate propulsion engines of the aircraft. Further extensions of this multiple source thinking may include the addition of multiple alternators or generators coupled to a single one of the propulsion engines and the addition of auxiliary power sources driven by a separate prime mover such as a small automatic-starting turbine engine. Parenthetically speaking, the present inventors recognize the formal distinction between the alternator and generator electrical sources recited in the foregoing discussion. For brevity and convenience purposes however, in the following description material this formal distinction is not rigidly observed and the term generator is, for example, used in a generic sense to refer to either machine. In another sense, this blurring of distinction can be rationalized in view of possible question as to the correct generic name for an alternator machine which includes an integral rectifier diode array and provides direct current output energy.

For the jet engine propelled aircraft of the future there is considerable interest in continuing this philosophy in an electrical machine that is directly integrated into the engine assembly. In such an arrangement the machine rotor is carried on the main compressor turbine shaft of the engine for example and is therefore driven without use of gearing which usually involves bearings and lubricants and other complexities. Additionally in such an arrangement the same machine can act as both an electrical motor for engine starting and as the source of aircraft electrical energy once the engine is running. The switched reluctance motor/generator electrical machine is found particularly desirable for such combination service since it is capable of high energy density operation, is free of brushes and their finite life characteristic and free of rotating windings and their support structure. Such a machine is capable of high revolution rates and provides additional performance advantages in the areas of reliability, weight and physical size. A generic aircraft propulsion engine arrangement of this type is shown in FIG. 8 of the drawings herein.

According to this present day thinking the switched reluctance motor/generator can be made part of an aircraft electrical system operating at considerably greater voltages than the twenty eight volts of direct current used in many present day aircraft electrical systems, i.e., a system operating at voltages in the range of two hundred seventy volts of direct current is considered feasible. The reduced amount of copper needed for electrical bus conductors is found to be attractive particularly from the aircraft weight penalty viewpoint with such operating voltage levels. The use of alternator type machines coupled to semiconductor rectifier or electrical switching devices are additional parts of this thinking.

According to an additional aspect of this contemplated future aircraft electrical system, it is desirable for such a switched reluctance motor/generator to be provided with a plurality of electrically independent winding circuits or winding channels, winding channels which may be operated each independent of the other with separate electronic regulation if needed or which may be connected in a combination such as a paralleled channel arrangement for a normal and fill utilization of the machine's energy transducer capacity. The electrically independent machine winding channels moreover may each be of a multiple winding phases nature. For example a three channel, three phase machine having a number of different rotor and stator pole configurations can be utilized according to this philosophy. One such machine configuration which appears especially attractive for this and for present invention purposes for example is comprised of a three channel, three phase eighteen pole stator and a twelve pole winding-free rotor. A machine of this nature is in fact disclosed in the later detailed description topic of the present document. It may be appreciated that a machine of this electrically independent winding circuits or winding channels type offers significant advantages when disposed within the propulsion engine of an aircraft or in other limited space locations since fitting the functionally equivalent plural separate machines in such locations, in order to obtain redundant electrical energy sources, could be difficult.

A primary purpose for using such a multiple winding channel, multiple phased switched reluctance motor/generator machine in a military or other aircraft resides in the above referred-to desire for reliability and redundancy in the aircraft—to provide crew protection and a maximally assured return to home base (after a mission involving battle damaged or inadvertent electrical energy source failure). When this damage occurs directly to the aircraft generator windings or when damage to other parts of the aircraft electrical system result in overload damage to the windings of a generator machine channel it is nevertheless desirable that the aircraft and its crew have some less than normal but adequate source of electrical energy available to operate the aircraft and its systems in returning home. Prior to the present invention such reduced operation of a switched reluctance motor/generator machine has been difficult because attempts to use remaining undamaged parts of the machine have inherently resulted in continued involvement of damaged portions of the machine, i.e., because the machines in question could not be divided into truly electrically isolated and magnetically isolated winding channels.

There is therefore perceived to be needed in the field of aircraft electrical machines, and in electrical machines used in other applications, a machine such as a multiple channeled switched reluctance motor/generator in which effective and substantially complete electrical isolation between electrical winding portions of the machine can be accomplished. Moreover it is desirable for such isolation to be accomplished in a manner which can be called into service quickly and preferably without human election—and preferably accomplished in a manner which provides an uninterrupted source of electrical energy. The present invention is believed to provide a viable answer to these needs.

The U.S. patent art indicates the presence of significant inventive activity in the area of electrical machines having at least general background relationship with machines made according to the present invention. Included in this patent art is the alternator electrical machine and alternator switching arrangement of U.S. Pat. No. 5,198,972 issued to LaFuze, a patent also assigned to the United States Air Force. In the LaFuze patent, semiconductor switching devices are connected to the output of a three phase alternator machine in a novel alternating current output phase switching arrangement. The invention is not however concerned with a reluctance motor/generator apparatus nor with the problem of maintaining at least partial operation in a damaged alternator system.

The U.S. Pat. No. 5,703,421 of Durkin is also of general background interest with respect to the present invention. This patent discloses a reluctance motor/generator machine possibly also suitable for aircraft use and for the combination duty of electrical energy source and engine starting in the aircraft. In the U.S. Pat. No. 5,703,421 patent, novel arrangements for extracting thermal energy from within the rotor and from the machine stator enclosure of the reluctance motor/generator are disclosed. The U.S. Pat. No. 5,703,421 patent is not however concerned with partial operation of a reluctance motor/generator machine under element failure conditions or with winding switching arrangements used to facilitate this partial operation as are involved in the present invention.

SUMMARY OF THE INVENTION

The present invention provides for a plural channeled electrical machine of the switched reluctance motor/generator type in which different machine channels can be substantially isolated each from the other in both the electrical and magnetic coupling senses.

It is an object of the present invention therefore, to provide a switched reluctance motor/generator machine operating algorithm affording partial shutdown operation of the switched reluctance motor/generator machine.

It is another object of the invention to provide a switched reluctance motor/generator algorithm in which changes can be implemented on the fly to maintain substantial operation of a damaged switched reluctance motor/generator or other system component.

It is an object of the present invention therefore, to provide a switched reluctance motor/generator machine operating algorithm in which electrically isolated winding channels may be separately regulated in electrical output and connected with separate loads when needed.

It is another object of the invention to provide a plurality of electrical circuit arrangements which may be used in operating a fault impaired switched reluctance motor/generator.

Additional objects and features of the invention will be understood from the following description and claims and the accompanying drawings.

DETAILED DESCRIPTION

Figure 1:
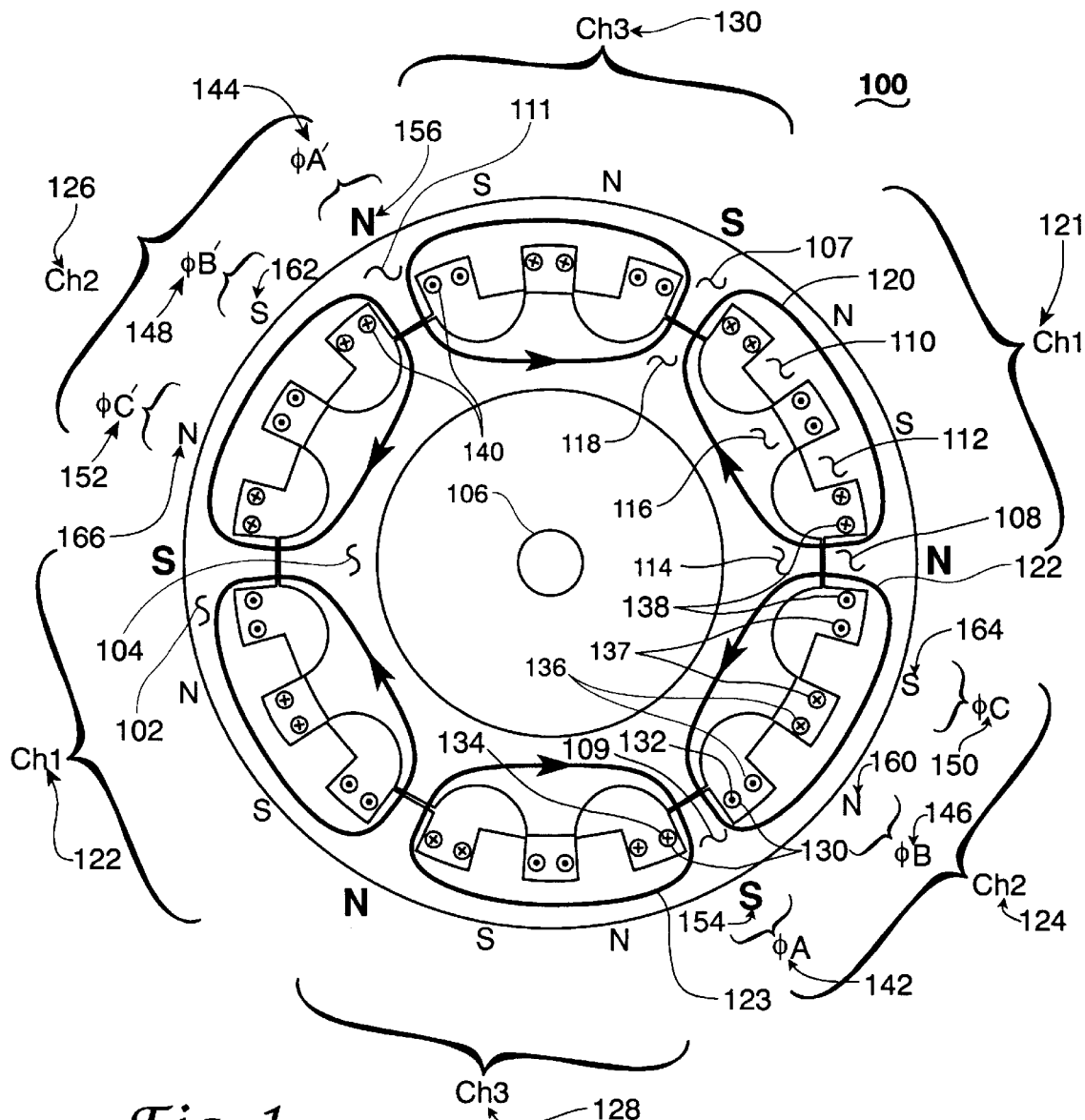
FIG. 1 shows a normally operating reluctance generator machine in cross sectional perspective together with pole, winding and magnetic flux details of the machine.

FIG. 1 in the drawings shows a normally operating reluctance motor/generator machine 100 of the eighteen pole stator and twelve pole rotor type in a machine cross sectional perspective. The rotor 104 of the FIG. 1 machine may be observed to rotate by way of a central axis-centered shaft 106 and to include the rotor salient poles 114, 116 and 118 plus additional non numbered rotor poles of a similar nature which total twelve rotor poles in all. The stator 102 of the FIG. 1 machine may be observed to include the stator salient poles 107, 108, 109, 110, and 112 plus additional non numbered stator poles of a similar nature totaling eighteen stator poles in all. Each stator pole in the FIG. 1 machine is provided with electrical windings as are symbolized by the circle pairs identified at 130, 136, 138 in FIG. 1. In the circle pairs as at 130 and 138 for example additional symbols representing current flow out of the drawing page and current flow into the drawing page, dot and plus signs respectively, indicate the customary arrow nose and tail representation of current flow direction.

The FIG. 1 drawing also shows pole, winding and magnetic flux details of the reluctance motor/generator machine 100 which may prevail during a selected instantaneous rotor and stator pole-aligned normal operating condition. The FIG. 1 reluctance motor/generator machine also includes at 142, 144, 146, 148, 150 and 152 a plurality of two letter symbols providing winding phase identity for several of the stator poles and their electrical windings. For the stator pole 109 for example the symbol φA at 142 indicates an identification of the representative winding symbols 130 as one half of the "A" phase of the channel 2 identified at 124. The remaining half of the channel 2 "A" phase winding is located diametrically opposite the pole 109 at the pole 111 where the windings 140 appear on the pole 111 along with the identifications φA' at 144. An additional identification of channel 2 components is noted at 126. As this identification arrangement suggests the two halves of the "A" phase winding at 130 and 140 are commonly connected electrically, a series or parallel electrical connection being contemplated although no such connection is required. Complete identification of each of the three winding channels occurs at 121, 122, 124, 126, 128, and 130 in the FIG. 1 drawing.

In a similar manner the symbol φB at 146 indicates an identification of the representative winding symbols 136 as one half of the "B" phase of channel 2. The remaining half of the "B" phase winding is located diametrically opposite at 148 where the identification φB' at 148 and the additional notation of channel 2 components at 126 is again relevant. In a continuing similar manner the symbol φC at 150 indicates an identification of the representative winding symbols 137 as one half of the "C" phase of channel 2. The remaining half of the "C" phase winding is located diametrically opposite where the identification φC' at 152 and the additional notation of channel 2 components at 126 is again relevant.

In addition to these identifications the instantaneous polarity of stator poles in the FIG. 1 drawing is indicated as shown typically at 154, 156, 160, 162, 164 and 166 with the differing letter sizes as shown at 154 and 160 for example indicating differing magnetic pole strengths as result for example from differing rotor and stator pole alignments. Generally the stator poles of the FIG. 1 machine in the FIG. 1 normal operating mode are alternating in magnetic polarity. Arrangements similar to those of channel 2 are used for the components of channel 1 as identified at 121 and 122 in FIG. 1 and for channel 3 as identified at 128 and 130. One half of the poles for channel 1 of the FIG. 1 machine are identified at 108, 110 and 112 with the pole at 108 conducting both channel 1 flux and channel 2 flux as is discussed in greater detail below. Other individual components for channels 1 and 3 are not labeled in the FIG. 1 drawing for drawing simplification reasons.

Representative flux flows and magnetic circuits used during operation of the FIG. 1 machine are indicated by the patterns at 120, 122, and 123 in the drawing. As indicated by these flux patterns 120, 122, and 123, the magnetic flux established during a FIG. 1 represented normal operation of the machine tends to involve relatively short magnetic paths which surround or attend the three phase windings of each identified channel of the machine. Flux flows in the non aligned poles, poles such as are shown at 110, 116 and 112 in FIG. 1 tend to be small with respect to the major flux flow shown at 120.

As is known in the art, the FIG. 1 machine accomplishes its energy transfer or energy transducer function by way of changing magnetic reluctance in the typical magnetic circuit of the flux path 122. This change results from increasing or decreasing rotor to stator pole alignment, and a resulting change in magnetic flux quantity existing in the typical magnetic circuit 122. A tendency to maximize this flux and minimize the reluctance of the magnetic circuit 122 generates a physical attraction between rotor and stator poles of the machine and thereby causes its motor action. A change of flux quantity in the magnetic circuit 122 as a result of rotationally occurring pole position changes induces electromotive force or voltage into the windings 130, and 138 and thereby causes generator action. Generally such generator action occurs as aligned rotor and stator poles are pulled apart against magnetic coupling forces by the mechanical input torque to the generator. Conversely electrical motor action occurs as separated rotor and stator magnetic poles tend to align under the influence of commonly threading and increasing magnetic flux.

Parenthetically it may be noted that when the FIG. 1 machine is operated as a reluctance generator machine as, is contemplated in major parts of the present disclosure material, there is need for supplying a source of magnetic flux within the machine (such flux is of course generated from by the electrical energy supplied to a motor when the machine is in motor operation). The FIG. 1 machine if mechanically driven from an aircraft engine or other prime mover cannot however originate the flux patterns shown at 120, 122, and 123 nor maintain these patterns, even if once established, without external energization or excitation, an energization and flux pattern establishment which are not represented in the FIG. 1 drawing. The required energization for the FIG. 1 machine when acting as a generator may be obtained through the use of an external energy source such as a battery, permanent magnet generator or capacitor—a capacitor such as the transient energy storing capacitor 513 in FIG. 5. Commutation events for this generator energization occur according to a cycle which is known in the art for a reluctance generator machine, a sequence which is additionally discussed in connection with the FIG. 4 through FIG. 7 drawings herein. Commutation for a reluctance motor machine is also known in the art and not additionally discussed herein.

The number of winding turns and the cross-sectional area of each turn in the windings of the FIG. 1 machine is of course determinative of the machine voltage, current and impedance operating levels. When combined with excitation or electrical loading involving switching circuitry the reluctance motor/generator is often referred—to using the name of a "switched reluctance motor" or a "switched reluctance generator". Switching for such usage may be provided by semiconductor devices such as transistors or controlled rectifiers with center of the former described herein as "power pole" high current transistor device offering particular utility. The present invention is not limited to being useful in winding failure events but may be employed to accommodate other failures as may occur in attached electrical network components for example. As implied elsewhere herein such components may be considered part of the machine.

Figure 8:
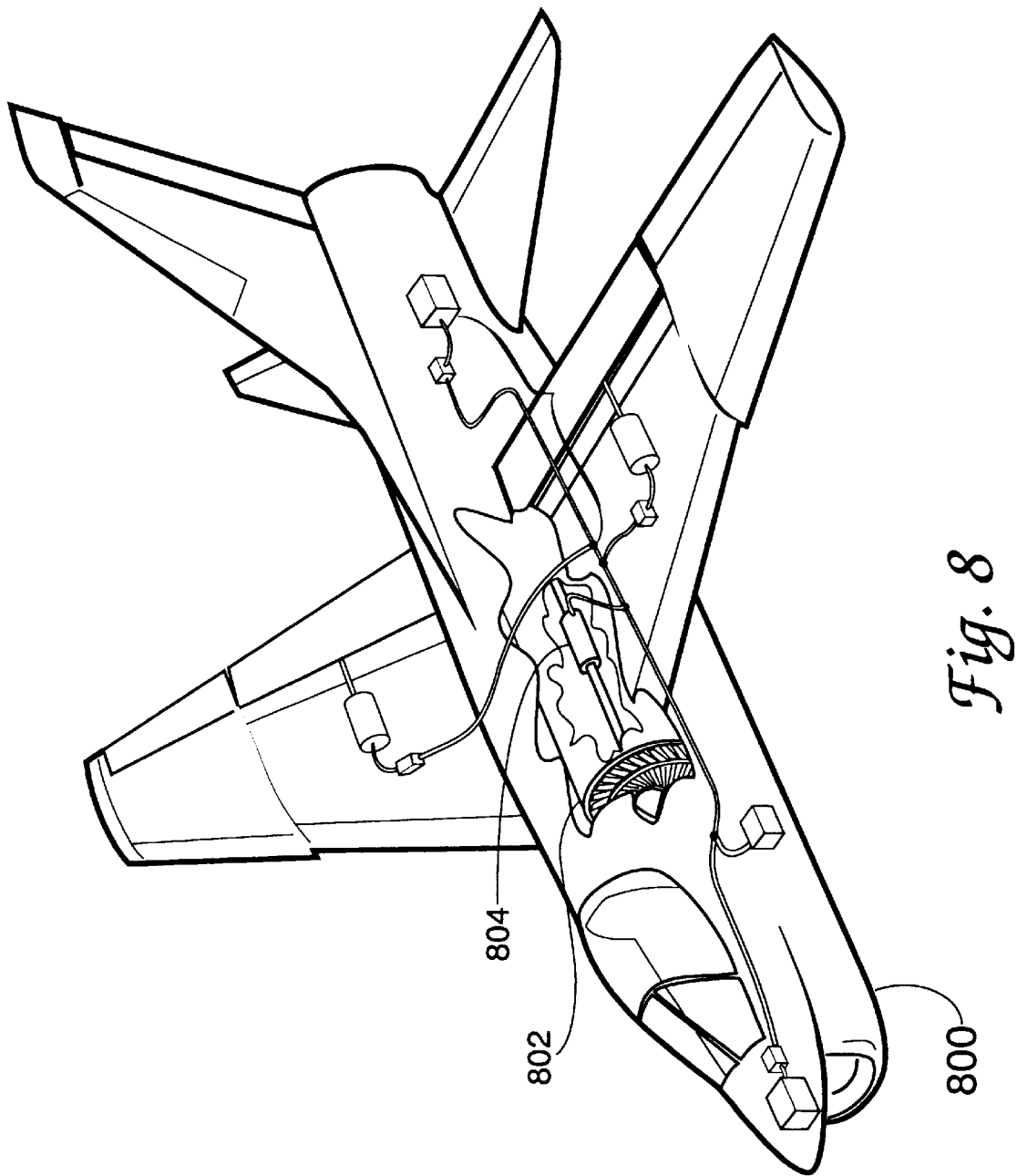
FIG. 8 shows a generic aircraft propulsion arrangement which includes a reluctance rotor generator of the present invention type.

As may be surmised from the above reliability discussion of aircraft and their electrical systems, a major justification for use of the three independent electrical channels represented in the FIG. 1 drawing lies in a desire to have these three channels be capable of functioning individually and independently of each other in cases of battle damage or other difficulty incurred by an aircraft carrying the FIG. 1 machine. A generic use of such a machine in the engine 802 of a typical tactical aircraft 800 appears at 804 in the FIG. 8 drawing.

Figure 2:
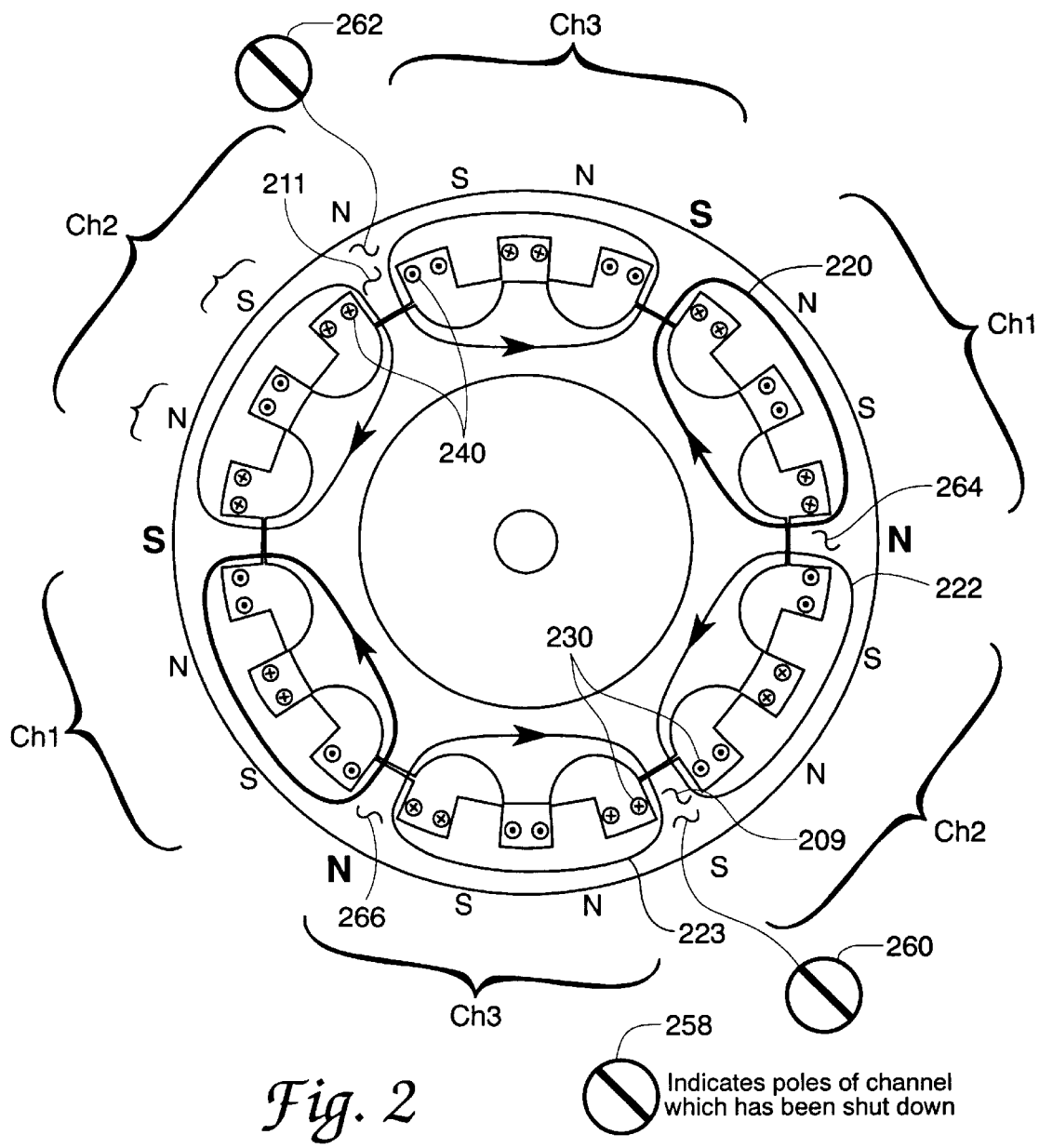
FIG. 2 shows other aspects of the FIG. 1 machine during an electrical fault condition and a simple accommodation of this fault.

A change in the operating mode of the FIG. 1 machine from the FIG. 1 represented normal three phase three channel operation to an operating mode in which one or two channels and their phases are inactive or inoperative as a result of an incurred electrical or other fault and shutdown cannot however be accomplished satisfactorily in the manner which could be considered a first blush change to the FIG. 1 operating mode. FIG. 2 in the drawings in fact illustrates such a first blush change in which the windings 130 and or 140 of channel 2 of the FIG. 1 machine are presumed to be in a failed condition, a condition indicated by the symbols 260 and 262, symbols defined in meaning at 258 in FIG. 2. (The FIG. 2 drawing repeats legend numbers from FIG. 1 using a two hundred series rather than a one hundred series number to the greatest degree possible; so also for the FIG. 3 and other drawings below.) As a result of this winding 230, 240 failure the entire channel of these windings, channel 2 of the FIG. 2 machine has been shutdown.

Fault responsive simple shutdown of the channel 2 windings by the FIG. 2 machine's controller electronics has changed the quantity of flux flowing between channel 2 and channel 3 and between channel 2 and channel 1 of the FIG. 2 machine—as is represented by the lighter depicted flux paths at 222 and 223. The lighter depicted flux paths at 222 and 223 may for example be considered to conduct flux at a density of 50 percent of that found in the path 220. Significantly therefore the decrease in common flux existing between channels 3 and 2 and the common flux existing between channels 1 and 2 does not result in a decrease to zero flux in poles 209 and 211 of the fault-incurred channel 2. Rather, a substantial maintenance of flux in the affected channel 2 occurs—because of flux paths shared with channels adjacent the shutdown channel. It is this maintenance of flux in the poles of a channel which has been "shutdown" which is especially undesirable and which suggests a need for the present invention. It should be appreciated therefore that the FIG. 2 flux patterns result from a simple shutdown of one channel, channel 2, in the FIG. 1 and FIG. 2 machine without other accommodation of the failure event i.e., the pole pattern and the flux flow paths in FIG. 2 are substantially similar to those established in the FIG. 1 operating mode excepting for flux quantity.

The maintenance of flux in a machine channel which has been shutdown as occurs in the first blush simple channel shutdown represented in FIG. 2 is undesirable and could be dangerous in an aircraft or other machine uses since this flux continues to generate electrical energy in the windings of the shutdown channel and can therefore lead to winding overheating and fire conditions in either the reluctance motor/generator machine itself or in machine elements or wiring or load remaining connected to the channel windings. Particularly in the case of a winding short circuit fault (such as a turn to turn or turn to ground fault) is the danger of winding overheat from the shutdown flux coupling present. Unfortunately however in the simplified shutdown represented in FIG. 2 the presence of stator poles of still active channels on either side of the shutdown channel poles, such as the poles represented at 264 and 266 in the FIG. 2 drawing, (poles which have the same polarity) provides a magnemotive force or a source of magnetic flux which will inherently flow in the relatively good and low reluctance magnetic circuit of the "shutdown" channel 2.

As a general rule therefore it appears that a first blush simple accommodation of a winding fault in the FIG. 2 machine requires a shutdown of the windings in two channels of the machine—the fault channel and one additional channel—when the shutdown is performed in accordance with a controller algorithm of the simple first blush type. In the single machine or single generator aircraft situation this reduction of a three channel machine to single channel operation is undesirable since the load necessary for a safe return to home could well exceed the capability of a single channel if the generator and aircraft loads are matched in a weight and space efficient manner (i.e. a 33 percent excess generator capacity is reasonable for accommodation of failure events however a 66 percent overcapacity in the generator can be an excess weight and size penalty to pay).

Figure 3:
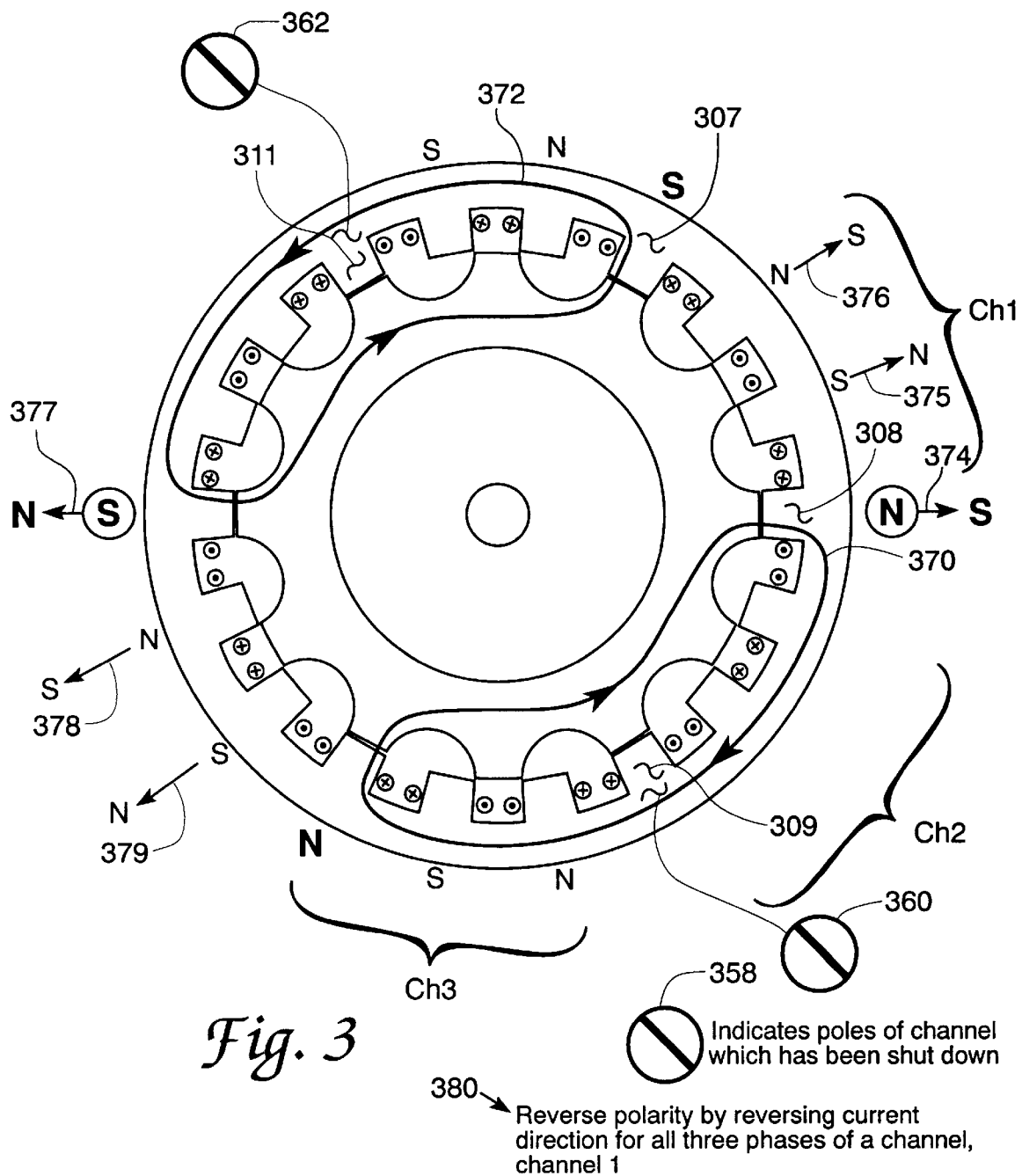
FIG. 3 shows the FIG. 1 and FIG. 2 machine with the same electrical fault condition operating according to the present invention.

A shutdown pole configuration according to the present invention, an arrangement which overcomes the continued flux involvement of the channel 2 poles (and flux paths 223 and 222 in FIG. 2 during a channel 2 shutdown) is shown in the FIG. 3 drawing. In FIG. 3 the same poles, now identified with the legend numbers 309 and 311, in view of the altered overall FIG. 3 pole configuration are deemed to include a winding or other channel fault which has resulted in a channel 2 shutdown—as in FIG. 2. In the FIG. 3 machine arrangement however something other than the simple shutdown of FIG. 2 has occurred; in fact in FIG. 3 an accommodation enabling the desired two channel-only operation of the machine has been accomplished. This accommodation appears in FIG. 3 in the form of the magnetic polarity reversals represented at 374, 375, 376, 377, 378, and 379 for the channel 1 poles of the machine. As indicated by the legend 380 in FIG. 3 this reversal is a manifestation of a general rule according to the present invention to the effect that in order to maintain desirable two channel operation of the FIGS. 1, 2, and 3 machines (under winding fault in one channel conditions) the magnetic polarity of each pole in one remaining channel of the machine should be reversed by the embodied machine control algorithm.

The rotor and stator magnetic flux paths which result from a FIG. 3 application of this general rule are shown at 370, 372 in the FIG. 3 drawing. These flux paths may be appreciated to involve both the remaining channel, channel 3, having normal mode polarities and the existence of a reversed pole polarity channel, channel 1, in the machine. Of particular interest in the FIG. 3 modified flux paths is the elongation of paths 370 and 372 which now encircle but do not traverse the poles 309 and 311 wherein the assumed winding fault lies. In contrast to the FIG. 2 simple shutdown arrangement therefore, the FIG. 3 shutdown has provided a flux path which avoids the existence of flux and the generation of significant electrical energy in the stator poles having the winding fault. As may be appreciated from a considered examination of the FIG. 3 drawing the modified flux paths 370 and 372 each include North and South stator poles of good rotor to stator pole alignment at opposed ends of each path and an absence of magnetomotive force at the intermediate poles 309 and 311 which are also in good alignment FIGS. 4 through 7 of the drawings herein show electrical circuit diagrams by which electrical generator operation of the FIG. 1 and FIG. 3 machines as described above may be accomplished. Pulse generating electrical circuitry for motor operation of the FIG. 1 through FIG. 3 machines is known in the art as is noted above. The electrical circuitry for one channel of a three channel, three phase generator machine of the type shown in FIG. 1 appears in FIG. 4 of the drawings. In this FIG. 4 circuit each phase leg is electrically connected by two switches and two diodes. To excite or energize a generator pole from the direct current output bus at 400 the two switches 402 and 404 of a phase pole winding 406 are turned ON, drawing power from the direct current bus 400. This passes current through the machine phase windings 406, commencing just prior to pole alignment, in the current direction shown by the solid arrow 408 and sets up the exciter magnetic flux needed for reluctance generator action in the machine's magnetic circuit.

During generator action in the windings 406 the two switches 402 and 404 are turned OFF, which results in current flowing through the winding 406 in the same direction, but now this current (from generator action) is conducted through the diodes 410 and 412 to the direct current bus 400 to supply electrical energy to the bus. This generator action current is shown by the dotted line 414 in the winding circuit of an adjacent phase pole channel circuit appearing in FIG. 4. Rotor position responsive timing for control of the switches 402 and 404 and the similar switches of each phase winding in the FIG. 4 diagram is provided by circuits located in the block 416 in FIG. 4. These circuits include timing control for each of the three phase legs shown in FIG. 3 with rotor position sensing being indicated by the dotted line 418. This rotor position sensing may involve electrical waveform responsive circuits, optical signal derived rotor position signals, or magnetically derived rotor position signals as are known in the art.

Figure 4:
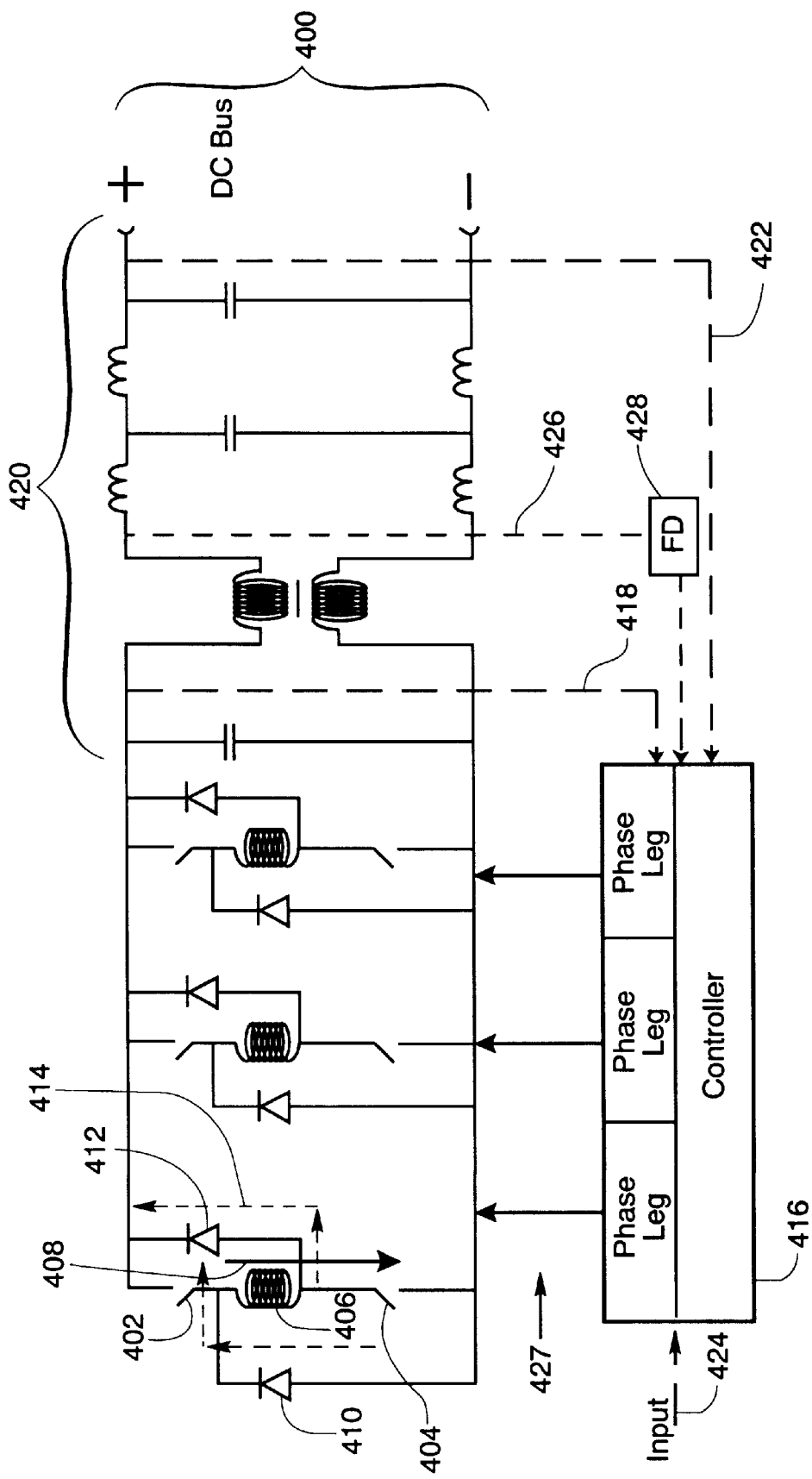
FIG. 4 shows a schematic block diagram of electrical circuitry suitable for exciting one channel of the FIG. 1 and FIG. 2 machines as a generator.

The signal path at 426 and the fault detector circuit 428 in FIG. 4 represent generally the manner in which electrical fault conditions in the windings of a machine channel or in the electrical components which connect with these windings may be detected in order to initiate the fault responsive channel shutdown and channel winding polarity reversal processes. Preferably a combination of current and voltage sensing (including waveform detail consideration) at some point in the electrical output path of the phases in each machine channel or in the electrical output path of the entire machine (as is represented by the signal path 426) is used to determine when an actionable fault condition has occurred. The fault detector circuit 428 may also be provided with signals derived from additional electrical waveform details or from specific shaft position sensing apparatus signals to assist in relating waveform electrical fault manifestations to specific rotor position and winding channel components and initiate the appropriate channel shutdown. The use of waveform sensing to determine operating conditions within a switched reluctance machine as is involved in the signals of both paths 418 and 426 in FIG. 4 is known to be an area of present activity by others working in this art.

In a broad sense the electrical elements shown in the FIG. 4 through FIG. 7 drawings may be considered to be integral parts of the electrical machines shown in the FIG. 1 through FIG. 3 drawings. Clearly these electrical elements are necessary to operation of the associated machine and moreover the system of the present invention is capable of accommodating a failure occurring in a switching element or other element in the FIG. 4 through FIG. 7 drawings as well as a machine winding failure event.

Electrical waveform filtering for the output energy of the FIG. 4 apparatus is provided by the inductive and capacitive network of elements indicated at 420 in the drawing. Output energy voltage levels are controlled by sensing signals communicated on the path 422 in FIG. 4 and a voltage set signal input is represented at 424. The switches 402 and 404 in the FIG. 4 apparatus are preferably embodied as one of field effect transistors, junction transistors or controlled rectifiers such as the silicon controlled rectifier or thyristor. Connection of these devices to the control circuitry of block 416 is provided along the paths indicated at 427. The control circuitry of block 416 may also include simple shutdown algorithm circuitry of the type described in connection with the FIG. 2 drawing herein, however the more desirable shutdown circuitry according to the present invention requires the more elaborate winding control arrangement of the next appearing FIG. 5 drawing. A circuit of the FIG. 4 drawing type is of course needed for each phase of the FIG. 1 machine for a total of nine circuits, only three of which are shown in FIG. 4. As is implied by the indication of a direct current output bus in the FIG. 4 drawing, machines of the FIG. 1, FIG. 2 and FIG. 3 types are operated in the rectified alternating current or direct current output mode of operation, output voltages in the 270 volt range discussed in an early part of the present document are feasible.

Figure 5:
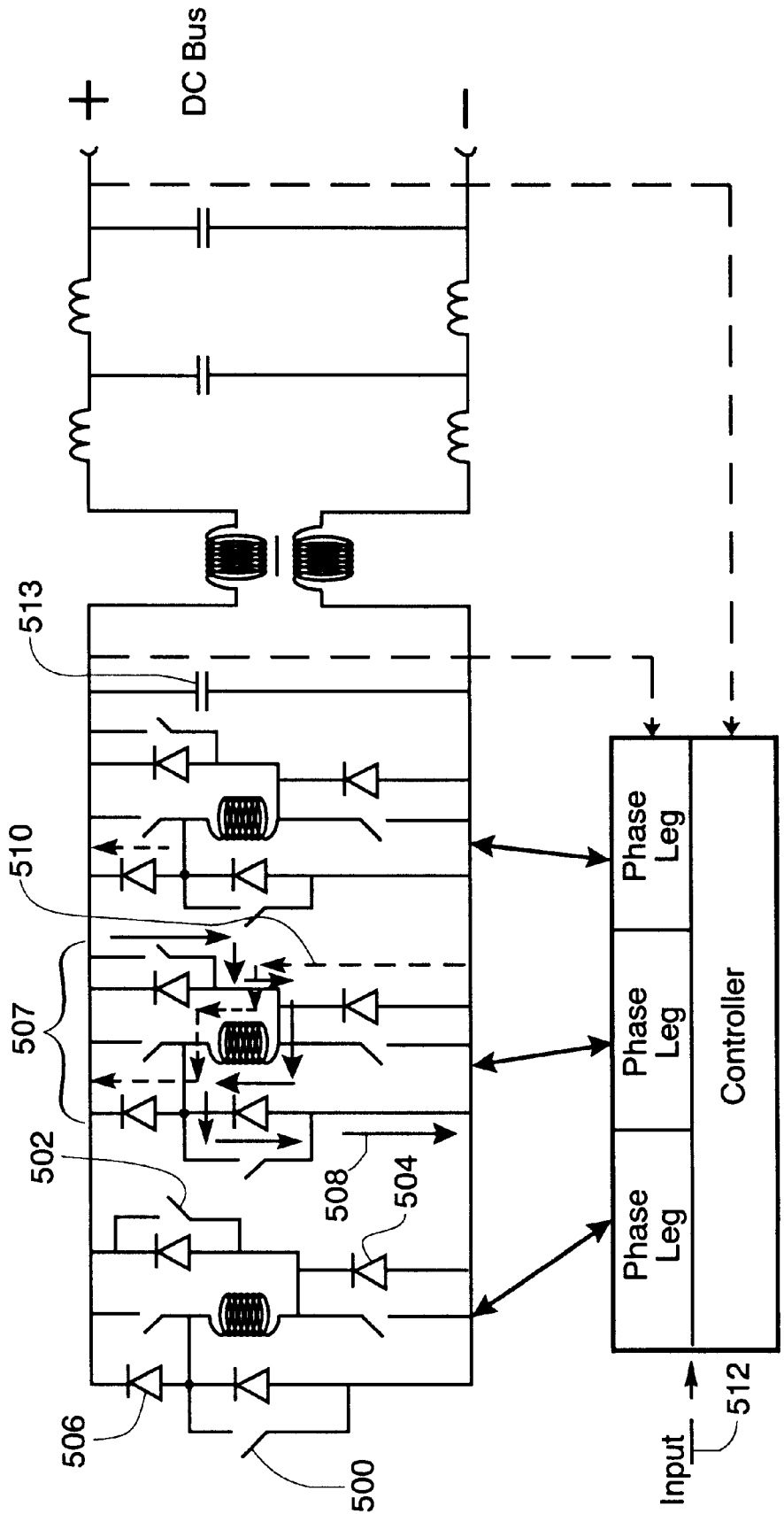
FIG. 5 shows a schematic block diagram of electrical circuitry suitable for exciting one channel of a FIG. 3 arrangement of the present invention as a generator.

FIG. 5 in the drawings therefore shows a circuit of the FIG. 4 type wherein two additional switches 500 and 502 and two additional diodes 504 and 506 have been added to the circuitry of each phase winding in order to achieve the FIG. 3—represented arrangement of the present invention. In the desired operation of the FIG. 5 circuit the additional switches 500, 502 and diodes 504, 506 do not conduct until a decision is made to reverse the polarity of the channel poles and channel windings. When polarity is reversed, the FIG. 4 related FIG. 5 switches, the switches as shown at 402 and 404 in FIG. 4, remain open and are not operated and the new switches and diodes of FIG. 5 are operated in the same manner as were the original FIG. 4 switches and diodes prior to reversing polarity. Current direction is shown by solid line arrows as at 508 in the circuit of adjacent phase 507 for both switches closed to excite a pole. The current is indicated by dotted line arrows as at 510 for the diode conduction to convey generated power back to the direct current bus in the FIG. 5 circuit.

The input signal received at 512 in the FIG. 5 drawing also includes as one of its components a signal indicating detection of a winding fault or fault in the FIG. 3 machine and a determination that this fault requires commencement of partial channel operation of the machine. The detection of such a machine fault condition can be accomplished in one of several possible ways including for example use of normally balanced current conditions in the two conductors relating to a winding, i.e., in the manner of the currently popular ground fault detector circuits used in kitchen, bath and outdoor residential wiring systems. Signals indicating abnormal current flow magnitudes or sudden decrease of winding voltages below a selected level may also be used in generating a fault detected signal.

Figure 6:
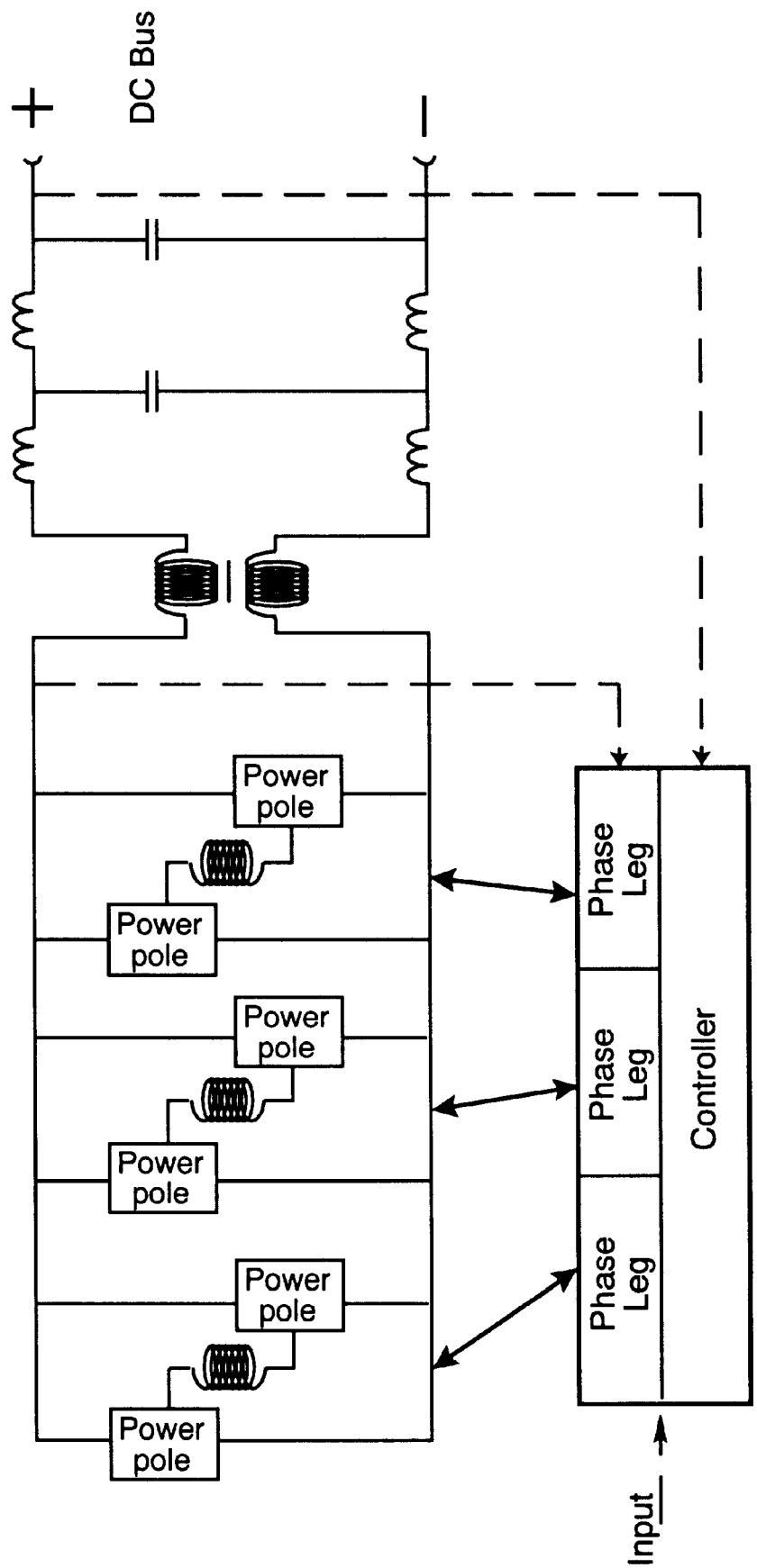
FIG. 6 shows a schematic block diagram of alternate electrical circuitry suitable for exciting one channel of the FIG. 3 machine as a generator.
Figure 7:
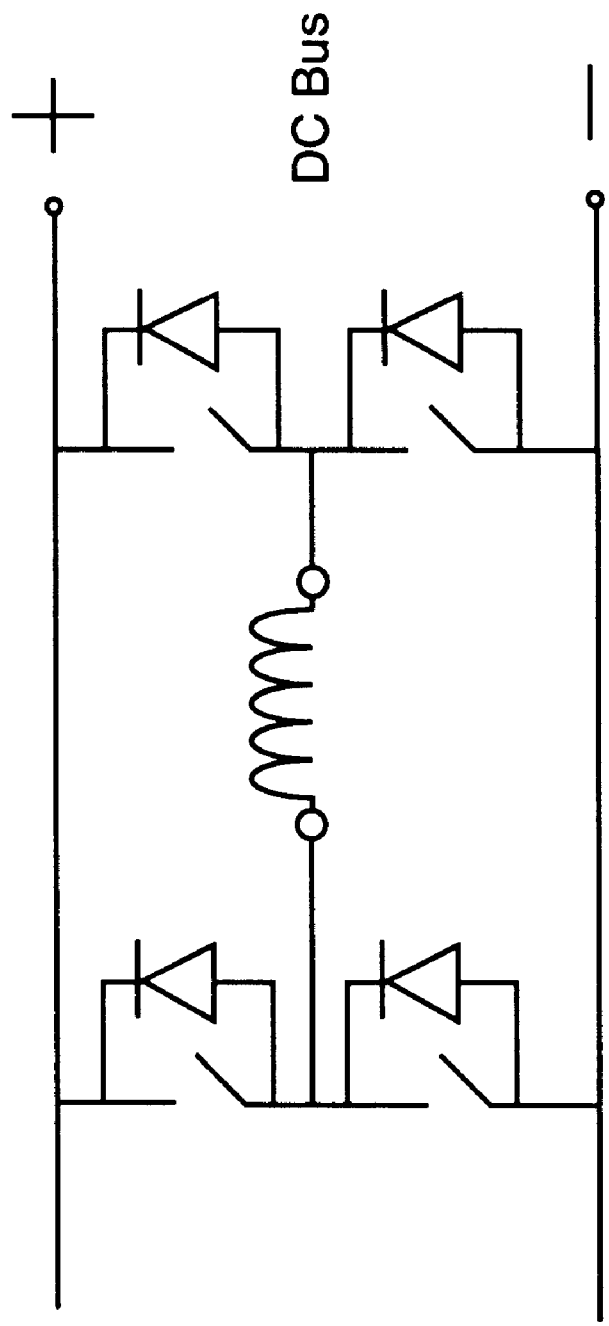
FIG. 7 shows additional details of components in the FIG. 6 diagram.

The FIG. 5 illustrated combination of four switches and four diodes per machine phase winding pair can also be implemented utilizing two standard "power pole modules" as is shown in FIG. 6 of the drawings. Power pole modules usually incorporate two switching devices (of the IGBT, MOSFET, MCT, etc. types) and two diodes all integrated into a single physical module. Unlike the discrete component power semiconductor devices arrangement shown in FIG. 4, a power pole module is a standard configuration available off the shelf as a self contained module. FIG. 6 illustrates the bi-directional current topology arrangement of the present invention utilizing six power pole modules and FIG. 7 shows the essential circuit content of two such power pole modules as they are connected to a typical winding of the present invention reluctance motor/generator machine. A power module of the IGBT type which appears suitable for use in the FIG. 6 and FIG. 7 circuits is available commercially from Fuji Semiconductor Incorporated as the type 2MBI300LB-060 module, a module of some 300 amperes current capacity. Such Fuji semiconductor devices are currently available in the United States from Collmer Semiconductor Incorporated of Dallas Tex., 75244. Other manufacturers offer similar suitable devices.

An additional advantage of the polarity switching of the present invention is the supplemental redundancy offered by the added switches and diodes shown in the FIG. 4 and FIG. 7 diagrams. If a single switch fails (except for a shorted switch) in any power converter circuit all three converters can immediately reverse polarity and keep all three channels operating. This is due to the failed switch not being required to operate in the reverse polarity mode of operation. A suitable control algorithm implementing this feature can be embodied into the block 416 circuits in FIG. 4 and the similar circuits of FIGS. 5 and 6.

The present invention therefore provides a switched reluctance motor/generator arrangement in which magnetic coupling tending to preclude fault tolerant multiple channel operation in the machine is limited in effect. The invention therefore enables achievement of the high reliability multiple source operation afforded by discrete multiple machines within the confines of a single machine. The invention is especially useful with certain pole configurations of the switched reluctance motor/generator machine such as the machine of eighteen/twelve rotor/stator pole configuration but not limited to this configuration. The invention is believed useful in the aircraft energy source arts but also not limited to this area of use. The concepts of the invention have been disclosed largely in terms of a reluctance motor/generator machine utilized in the electrical generator mode of operation but may be applied also in the electrical motor mode of operation where mechanical loads within the torque capability of a partially operating machine are to be driven.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. Electrical fault accommodating multiple channel multiple phase reluctance motor/generator apparatus comprising the combination of:

a salient poled electrical rotor member of N electrical poles and winding-free interpole spaces received along a lengthwise extending central axis of said reluctance motor/generator apparatus;

a salient poled electrical stator member of N plus M electrical poles and electrical winding-containing interpole spaces received surrounding said salient poled electrical rotor member along said lengthwise extending central axis of said reluctance motor/generator apparatus;

said stator electrical windings being divided into at least three electrically isolated channels of P electrical phases each with each phase of each channel including magnetic poles and associated electrical windings dispersed about said salient poled stator member;

an electrical fault detector circuit connected with said motor/generator apparatus stator electrical windings and generating an electrical fault detected signal in response to electrical fault conditions sensed in a winding channel electrical energy path of said motor/generator apparatus;

a plurality of electrical winding switching elements responsive to a control signal from said fault detector circuit and connected in a bi-directional winding current controlling switching array between said stator electrical windings and an electrical bus coupled to said motor/generator apparatus;

an electrical control apparatus including a winding disconnect control algorithm also controlling said electrical winding switching elements, and excluding from connection with said electrical bus, windings of a winding channel generating said electrical fault detected signal;

said control apparatus additionally including a winding current direction determination algorithm also controlling said electrical winding switching elements and enabling reversed magnetic polarity operation within each phase winding of a remaining non faulted winding channel in said motor/generator apparatus in response to said electrical fault signal.

2. The electrical winding fault accommodating reluctance motor/generator apparatus of claim 1 wherein said bi-directional winding current controlling switching array provides pulsed energization for and rectified direct current output energy from said reluctance motor/generator apparatus.

3. The electrical winding fault accommodating reluctance motor/generator apparatus of claim 1 wherein said apparatus comprises a combination engine starting electrical motor and electrical energy generating transducer in an aircraft.

4. The electrical winding fault accommodating reluctance motor/generator apparatus of claim 3 wherein said combination engine starting electrical motor and electrical energy generating transducer is disposed as a directly coupled and directly driven integral portion of a propulsion engine in said aircraft.

5. The electrical winding fault accommodating reluctance motor/generator apparatus of claim 1 wherein said numerical constants of N, M and P have values of twelve, six and three respectively and said reluctance motor/generator is therefore a machine of eighteen stator poles, twelve rotor poles and three electrical winding channels of three electrical phases each.

6. The electrical winding fault accommodating reluctance motor/generator apparatus of claim 1 wherein said rotor and stator members each include sufficient magnetic flux conducting material to enable both first magnetic flux paths encompassing rotor and stator regions immediately adjacent each winding channel portion of said reluctance motor/generator apparatus during normal unfaulted winding operation and second magnetic flux paths encompassing rotor and stator regions adjacent more than a single winding channel portion during winding fault-detected reversed channel polarity operation of said reluctance motor/generator apparatus.

7. The electrical winding fault accommodating reluctance motor/generator apparatus of claim 1 wherein said electrical winding fault detector circuit includes an electrical waveform sensing algorithm.

8. The electrical winding fault accommodating reluctance motor/generator apparatus of claim 1 wherein each of said P electrical phase windings of said stator electrical windings includes a first partial phase winding and a second partial phase winding located on diametrically opposed stator poles of said reluctance motor/generator apparatus.

9. The electrical winding fault accommodating reluctance motor/generator apparatus of claim 1 wherein said electrical winding fault detector circuit includes electrical circuitry responsive to an electrical fault condition in either of windings and winding connected electrical components of said apparatus.

10. The electrical winding fault accommodating reluctance motor/generator apparatus of claim 1 wherein said electrical winding fault detector circuit includes electrical circuitry responsive to one of a short circuit to machine frame, a winding open circuit and a short circuit between winding turns electrical circuit condition in said fault detected winding channel windings.

11. A dynamic method for enabling continued partial operation of a reluctance motor/generator machine in the presence of a partial machine electrical failure event, said method comprising the steps of:

configuring said reluctance motor generator machine in a selected rotor and stator pole configuration, a configuration defining plural electrically isolated stator pole winding channels and supporting normal operation first rotor and stator magnetic flux patterns in poles of each said machine channel;

connecting said machine stator channel windings in a redundant, electrically parallel, full machine output-enabling manner to a reluctance motor/generator machine electrical bus array;

electrically detecting an occurrence of an electrical failure event in one of said stator winding channels;

reconfiguring said normal operation first rotor and stator magnetic flux patterns in said machine, in response to said detected electrical failure event, to second modified operation patterns of rotor and stator magnetic flux, patterns comprising a lesser number of machine winding channels, patterns including longer rotor and stator magnetic flux paths and patterns including flux paths independent of poles relating to said detected electrical failure event;

continuing operation of said reluctance motor/generator machine in said reconfigured rotor and stator magnetic flux pattern mode of operation until an elected operation termination is convenient.

12. The method for enabling continued partial operation of a reluctance motor/generator machine of claim 11 wherein said machine is energized as a mechanical torque generating electrical motor.

13. The method for enabling continued partial operation of a reluctance motor/generator machine of claim 11 wherein said machine is operating as an electrical energy producing electrical generator machine.

14. The method for enabling continued partial operation of a reluctance generator machine of claim 13 wherein said step of reconfiguring said normal operation first rotor and stator magnetic flux patterns includes altering conduction state in a plurality of semiconductor switching devices and reversing magnetic polarity in a plurality of remaining normal winding channel-related machine stator poles.

15. The method for enabling continued partial operation of a reluctance generator machine of claim 13 wherein said stator winding channels each include a plurality of phase windings each having a first and second winding portions disposed on diametrically opposite lateral sides of said machine stator.

16. The method for enabling continued partial operation of a reluctance generator machine of claim 15 wherein said machine comprises a number N of rotor poles equal to twelve, a number N plus M of stator poles equal to eighteen, a number of electrical winding channels equal to three, a number of electrical phase windings in each channel equal to three and with each phase winding including first and second winding portions disposed on opposite lateral sides of said machine stator.

17. The method for enabling continued partial operation of a reluctance generator machine of claim 13 wherein said machine includes three electrical winding channels and said step of reconfiguring said normal operation first rotor and stator magnetic flux patterns in said machine includes operating said machine with reversed magnetic polarity in a plurality of stator phase winding magnetic poles comprising a second electrical winding channel of said machine, said second electrical winding channel of said machine being physically segregated from a normal third channel of said machine by additional winding channel phase poles.

18. The method for enabling continued partial operation of a reluctance generator machine of claim 17 wherein said failed winding poles are disposed intermediate stator poles of the same magnetic polarity during said reconfigured operation.

19. The method of maintaining substantial but diminished electrical output operation in an N plus M numbered stator pole and N numbered rotor pole switched reluctance generator following one of a partial generator stator winding failure event and a winding-coupled partial failure event; that is, following an electrical failure event in said generator, said method comprising the steps of:

dividing said N plus M stator poles of said switched reluctance generator into C electrical winding channels of P electrical winding phases each, said electrical channel phases each including electrical windings attending P rotationally displaced diametrically opposed stator pole pairs of said generator;

coupling each said opposed stator phase winding pair via switchable, stator winding current direction-determining, electrical network connections to an energy output bus of said generator;

operating said switchable stator winding current direction-determining electrical network connections in a rotor position responsive switched reluctance machine cycle to generate, from a mechanical energy input, a direct current electrical energy output from said stator pole pair phase windings at said generator energy output bus;

detecting in one of said C generator electrical winding channels an occurrence of said electrical failure event;

opening switchable electrical network connections coupling said generator electrical failure event electrical winding channel, including phase winding pairs thereof, with said generator energy output bus in response to said detecting of an electrical failure event;

reversing switchable electrical network connections coupling a selected remaining generator electrical winding channel adjacent said electrical failure event electrical winding channel, including switchable couplings attending each of said reversed electrical winding channel phase winding pairs and selected electrical winding channel phase winding current flow directions and selected electrical winding channel pole polarities of said selected remaining electrical channel, with said generator energy output bus in response to detecting said electrical failure event;

continuing use of said switched reluctance generator, at diminished electrical output levels, using altered longer rotor and stator magnetic flux paths enabled by a cooperation between said reversed generator electrical winding channel and a remaining normal Cth generator electrical winding channel.

20. The method of claim 19 wherein said N rotor poles are twelve in number, said N plus M stator poles are eighteen in number, with M having therefore a value of six, said P phases are three in number and said C channels are three in number.

21. The method of claim 20 wherein normal all-channel all-phase operation of said switched reluctance generator includes a plurality of rotor and stator magnetic flux flows substantially limited to adjacent phase stator poles within each generator electrical winding channel and said altered rotor and stator magnetic flux paths include longer rotor and stator magnetic flux flows surrounding poles of a plurality of electrical channel poles of said generator.

22. The method of claim 19 wherein said step of opening switchable electrical network circuit connections comprises terminating conduction in a semiconductor electronic device.

* * * * *